United States Patent

Hung et al.

[11] Patent Number: 6,100,557
[45] Date of Patent: Aug. 8, 2000

[54] TRIPLE WELL CHARGE PUMP

[75] Inventors: Chun-Hsiung Hung, Hsinchu, Taiwan;
Ray-Lin Wan, Fremont, Calif.;
Yao-Wu Cheng, Taipei, Taiwan

[73] Assignee: Macronix International Co., Ltd., Hsinchu, Taiwan

[21] Appl. No.: 08/849,561

[22] PCT Filed: Oct. 10, 1996

[86] PCT No.: PCT/US96/16317

§ 371 Date: May 12, 1997

§ 102(e) Date: May 12, 1997

[87] PCT Pub. No.: WO98/16010

PCT Pub. Date: Apr. 16, 1998

[51] Int. Cl.[7] .................................................. H01L 29/72
[52] U.S. Cl. .......................................... 257/299; 257/371
[58] Field of Search .................................... 257/299, 371

[56] References Cited

U.S. PATENT DOCUMENTS 5,394,365  2/1995  Tsukikawa .................... 365/189.09
5,489,870  2/1996  Arakawa ........................... 327/536
5,502,629  3/1996  Ito et al. .............................. 363/60
5,612,921  3/1997  Chang et al. ...................... 257/399

FOREIGN PATENT DOCUMENTS 0 319 063   6/1989  European Pat. Off. .
0 678 970  10/1995  European Pat. Off. .

*Primary Examiner*—Edward Wojciechowicz
*Attorney, Agent, or Firm*—Mark A. Haynes; Haynes & Beffel LLP

[57] ABSTRACT

An improved charge pump design is disclosed. This charge pump comprises at least one pumping transistor having a triple well arrangement. This triple pump transistor has a source and a drain region of a first conductive type formed on a first well having an opposite conductive type. A second well having the first conductive type is formed outside of the first well. The source region, first well and second well are set to substantially the same potential. One aspect of this configuration is that the first well forms a semiconductor diode with the drain region. Another aspect of this arrangement is that the body effect of the transistor is reduced. The reduction in body effect reduces the threshold voltage of the transistor. It is found that the above mentioned diode and threshold voltage reduction, singly and in combination, allow the charge pump to operate more efficiently.

13 Claims, 6 Drawing Sheets

TRIPLE WELL CHARGE PUMP

FIELD OF THE INVENTION

The present invention relates to charge pump circuits, and more particularly to using triple well transistors in the design of charge pump circuits.

BACKGROUND OF THE INVENTION

A charge pump is a circuit that can generate an output voltage that is higher than the voltage supplied to the charge pump. One of the applications of charge pumps is to develop voltage for erasing and programming some kinds of non-volatile semiconductor memory devices, such as electrical erasable programmable read only memory (EEPROM) and flash memory. One way to operate these memory devices is to program through hot electron injection and erase through Fowler-Nordheim tunneling. The programming and erasing of such a memory cell require current to pass through the dielectric surrounding a floating gate electrode. As a result, a high voltage is generally needed. Some prior art nonvolatile semiconductor memory devices require the application of an external high voltage (e.g, 12 volts) in addition to a regular 5 volts supply voltage. This arrangement is undesirable because it is complicated and wastes real estate on circuit boards. Recently, many nonvolatile semiconductor memory device manufacturers place charge pumps on chip so as to develop the required high voltage for erasing and programming. Many customers welcome this development, and the sale of nonvolatile semiconductor devices increases.

As the number of memory cells in a nonvolatile semiconductor memory device increases, the current required to erase and program these cells also increases. As a result, there is a need for the charge pump to be efficient, e.g., generating more current and at a faster rate.

SUMMARY OF THE INVENTION

The present invention relates to using triple well transistors to increase the efficiency of a charge pump. The inventive charge pump comprises a plurality of pumping transistors arranged to increase the voltage level, or push the voltage lend to a negation valve, from a first pumping transistor to a last pumping transistor in response to clock pulses applied to these pumping transistors. At least one of the plurality of pumping transistors has a source and a drain region of a first conductivity type formed on a first well having an opposite conductivity type.

A second well having the first conductivity type can be formed outside of the first well. The second well is fabricated on a substrate. This transistor design is commonly referred to as a "triple well" transistor. The source region, first well and the second well are preferably set to substantially the same potential. In one embodiment of the present invention, the second well can be set to the highest positive potential of the charge pump.

One aspect of this configuration is that the first well forms a semiconductor diode with the drain region. This diode allows more current to flow through the pumping transistor, when compared with a pumping transistor of conventional construction. Another aspect of this arrangement is that it reduces the body effect of the triple well transistor. As a result, the threshold voltage of the transistor is reduced. The reduction in threshold voltage allows the transistor to be turned on faster.

It is found that the above mentioned diode and threshold voltage reduction effects, singly and in combination, allow the charge pump to operate more efficiently. Examples of the improved efficiency include increasing the output current, lowering the power supply voltage level, and increasing the operating frequency.

The triple well pumping transistor of the present invention can be used in positive voltage and negative voltage charge pumps.

These and other features of the present invention will become apparent from the following detailed description of the invention read in conjunction with the accompanying drawings.

DETAILED DESCRIPTION OF THE INVENTION

The present invention related to a novel charge pump system. The following description is presented to enable any person skilled in the art to make and use the invention. Descriptions of specific applications are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
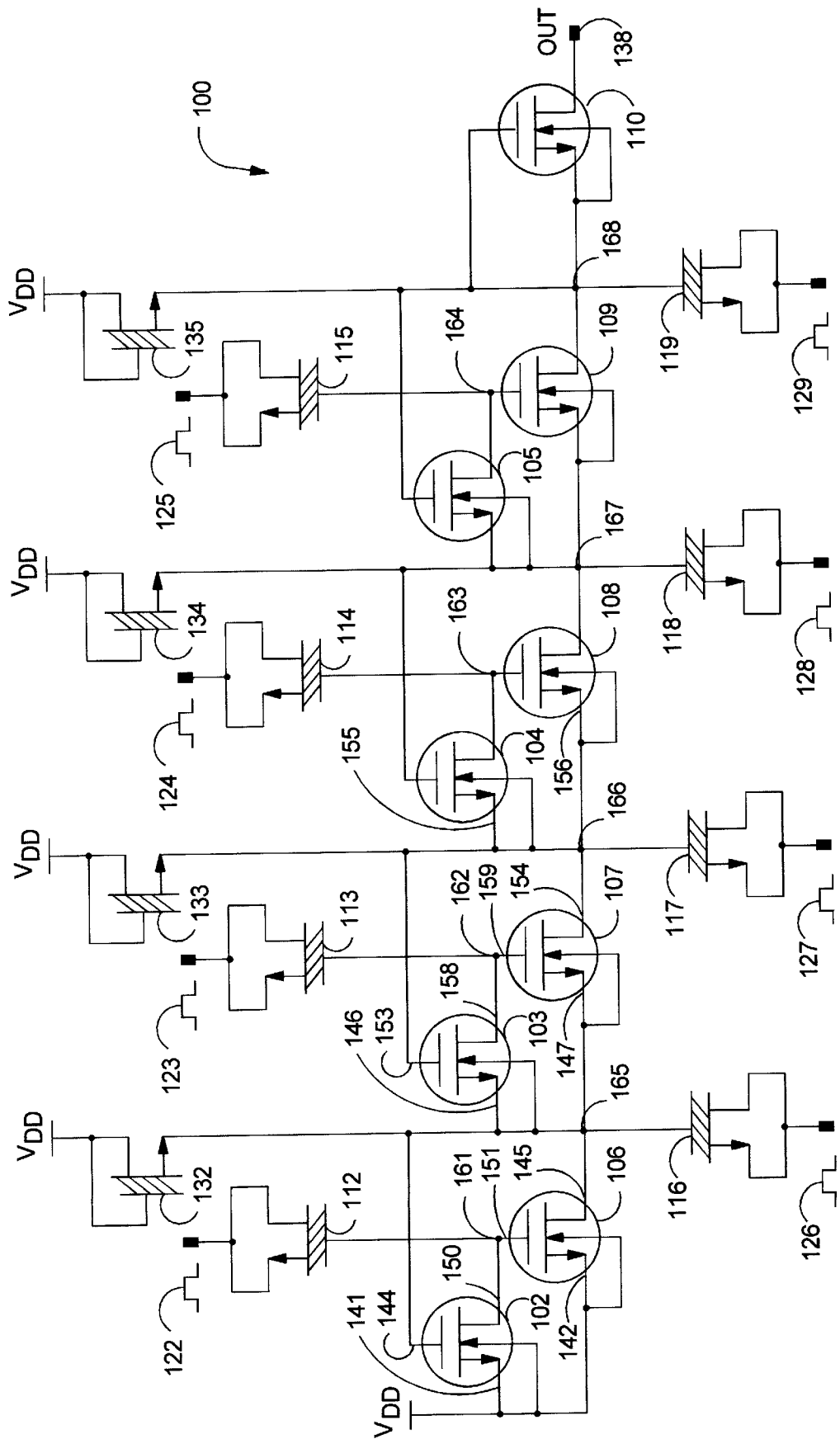
FIG. 1 is a schematic diagram of a four-stage charge pump of the present invention.
Figure 2:
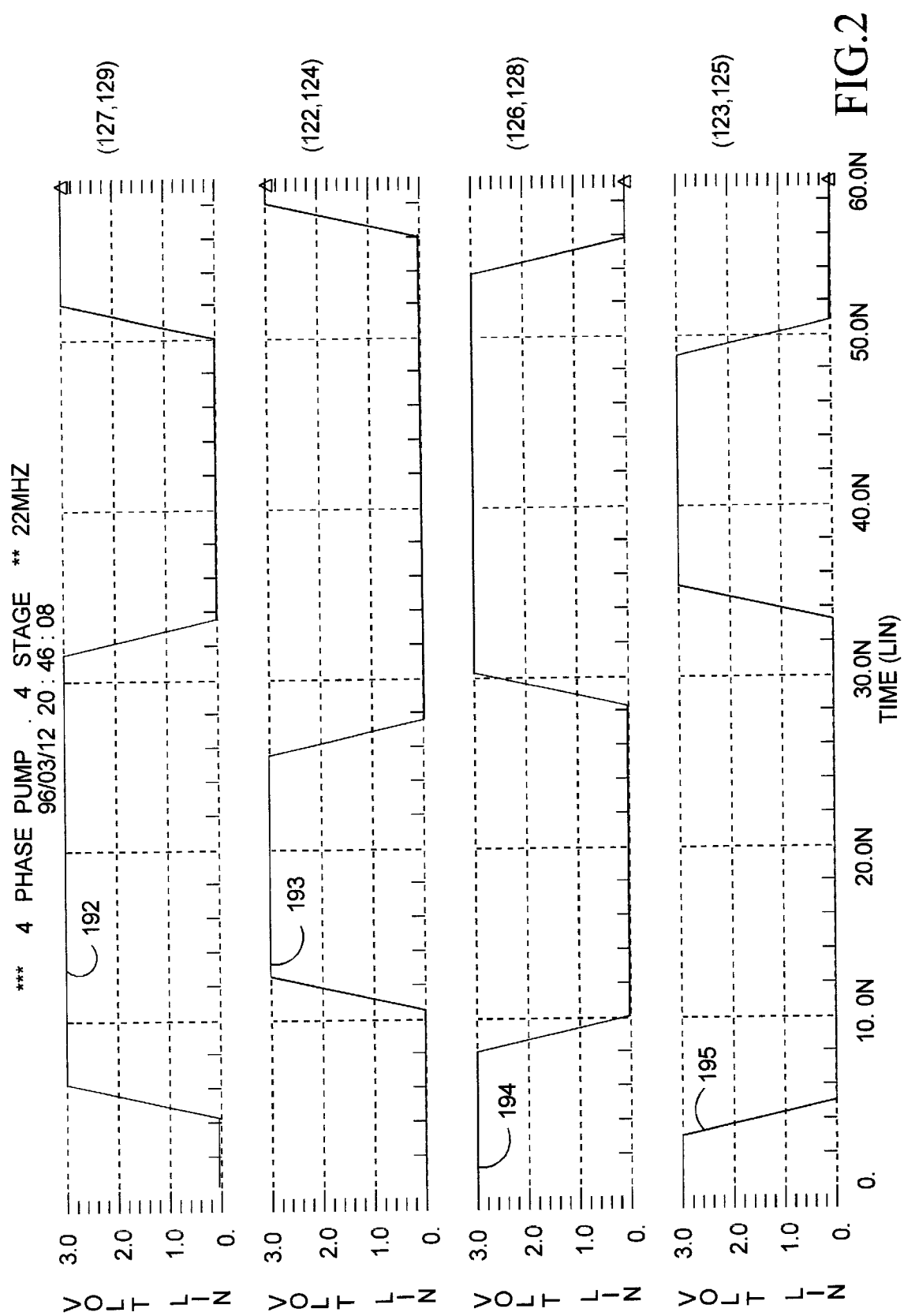
FIG. 2 shows timing diagram of clock signals pulses that can be used with the charge pump of FIG. 1.

FIG. 1 is a schematic diagram of a four-stage charge pump 100 of the present invention. Charge pump 100 comprises nine triple well NMOS transistors 102–110 and twelve normal NMOS transistors 112–119 and 132–135. These normal NMOS transistors are preferably native n-channel devices that have a low threshold voltage. Normal NMOS transistors 132–135 function as pull up transistors. Normal NMOS transistors 112–119 function as capacitors, and are coupled to clock signals 122–129. The clock signals are coupled to the corresponding triple well NMOS transistors via the capacitive action of transistors 112–119. Although there are eight clock signals, they are arranged in pairs: (122,124), (123,125), (126,128), and (127,129). Each clock signal in a pair has the same signal timing while different pairs have different signal timings. The clock signals are shown in FIG. 2 where timings 192–195 correspond to pairs (127,129), (122,125), (126, 128) and (123, 125), respectively. These signals alternatively boost up the gates of these capacitors. This results in an increase in voltage level from stage to stage. The way voltage is being pumped up is similar to a conventional charge pump. In one embodiment of the present invention, the output voltage at the drain terminal of triple well NMOS 110 is approximately 10.5 volts while the voltage supplied to charge pump 100 is only 3 volts. As explained in detail below, the use of these triple well transistors (instead of normal NMOS transistors) enhances the performance and efficiency of charge pump 100 compared to prior art four-stage charge pumps.

It should be noted that a charge pump preferably includes other associated circuits, e.g., precharge and voltage regulation circuits. These circuits are well known by persons of ordinary skill in the art, and will not be described here.

Figure 3:
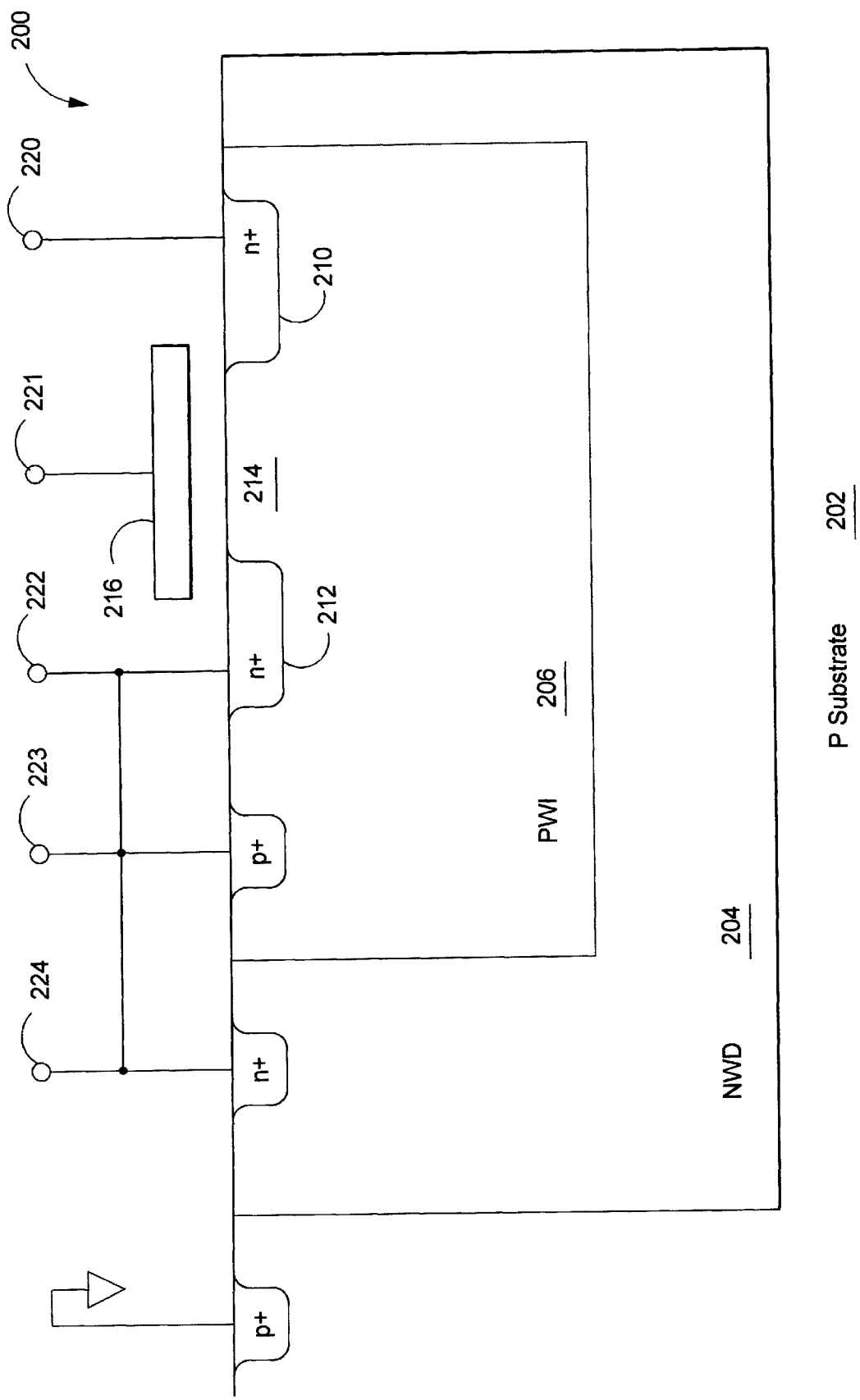
FIG. 3 shows, schematically, a cross sectional view of a triple well NMOS transistor of the present invention.

FIG. 3 shows, schematically, a cross sectional view of a triple well NMOS transistor 200 that can be used for transistors 102–110 of FIG. 1. Transistor 200 is fabricated on a p-type substrate 202. An N well 204 is formed in substrate 202, and a P well 206 is formed in N well 204. An N+ type drain region 210 is formed in P well 206, as is an N+ source region 212. A channel region 214 is defined between source and drain regions in P well 206. A polysilicon gate 216 is positioned above channel region 214. A thin gate oxide is deposited between gate 216 and channel region 214. Drain region 210, gate 216, source region 212, P well 206, and N well 204 are coupled to individual terminals 220–224, respectively. Thus, triple well transistor 200 can be considered a five-terminal device. In one embodiment of the present invention, the N+ source and N+ drain are interchangeable when the charge pump is activated because either terminal may have higher potential than the other.

In one embodiment of the present invention, the potential of source region 212, P well 206 and N well 204 are set to the same value. One way to meet this condition is to electrically connecting terminals 222, 223 and 224. The potential of substrate 202 is normally set to ground. This arrangement creates a PN diode between P well 206 and drain region 210. The diode is inherent in this triple well construction, and does not occupy any extra silicon area. This diode is able to conduct significant amount of current after it is turned on, and thus adds an extra low resistance path to the NMOS transistor. In this application, this diode is called an "extra diode." As explained in more detail below, this extra diode has the following advantageous effects:

(1) The size of the pass gate of the triple well NMOS transistors 102–109 can be reduced because some of the current for charging the next stage NMOS capacitors (i.e., transistors 112–119) can be conducted by the extra diode.

(2) Because the size of the NMOS transistors 102–109 can be reduced, their parasitic capacitance is reduced. As a result, less power is consumed and the pump output current can be increased.

(3) This low resistance extra diode path increases the forward conduction current. It can increase the pumping frequency because charges can be built up faster.

(4) The extra diode conduction path reduces the peak voltage swing at the output transistor 110 from $V_{DD}$+ $V_{out}$ to 0.7+$V_{out}$ volts, where $V_{DD}$ is the power supply voltage and $V_{out}$ is the output voltage at an output terminal 138 of charge pump 100. As a result, the internal voltage stress of the charge pump is reduced.

As a result of the above mentioned advantages, the performance of charge pump 100 improves tremendously by the presence of this diode. This benefit is achieved without requiring any silicon real estate.

Another advantage of this arrangement is that the body effect is suppressed. Body effect arises when the source and substrate junction is reverse biased. It is well known that the threshold voltage of a NMOS transistor is given by:

$$V_T = V_{T0} + \gamma \sqrt{[(V_{BS} + V_{BI})^2 - (V_{BI})^2]},$$

where $V_{T0}$ is the threshold voltage when there is no substrate bias, $V_{BS}$ is the potential between the source and the body, and $V_{BI}$ is the voltage difference of a P-N junction if no external voltage is applied (i.e., zero bias). The typical values for $V_{T0}$, $V_{BI}$ and $\gamma$ are 0.7 volt, 0.7 volt, and 0.4, respectively.

It can be seen from the above equation that applying a voltage across a reverse-biased source-substrate junction tends to increase the threshold voltage of a transistor. In the triple well transistor of the present invention, $V_{BS}$ is limited within the P-N junction cut-in voltage of 0.7 volt. This is because when pumping is activated, charge flows from N+ diffusion region 212 to N+ diffusion region 210 through channel 214 and the extra diode created by well 206 and region 210. Thus, the lower potential N+ diffusion region 210, which is the source, suffers minimized substrate bias around 0.7 volt which is much less as compared to more than 10 volts of substrate bias in prior art regulator NMOS charge pumps. In a charge pump circuit, it is important to generate high forward conduction current so that charges can be build up quickly. A low threshold voltage allows the NMOS channels to be turned on faster, and thus can increase the pumping frequency. Because the threshold voltage of the triple well NMOS transistor of the present invention is very low, the pumping frequency of the present inventive charge pump can be much higher than prior art charge pumps. In an embodiment of the present invention, the charge pump can operate efficiently at 22 MHz while prior art charge pump typically operates at 10 MHz.

Figure 4:
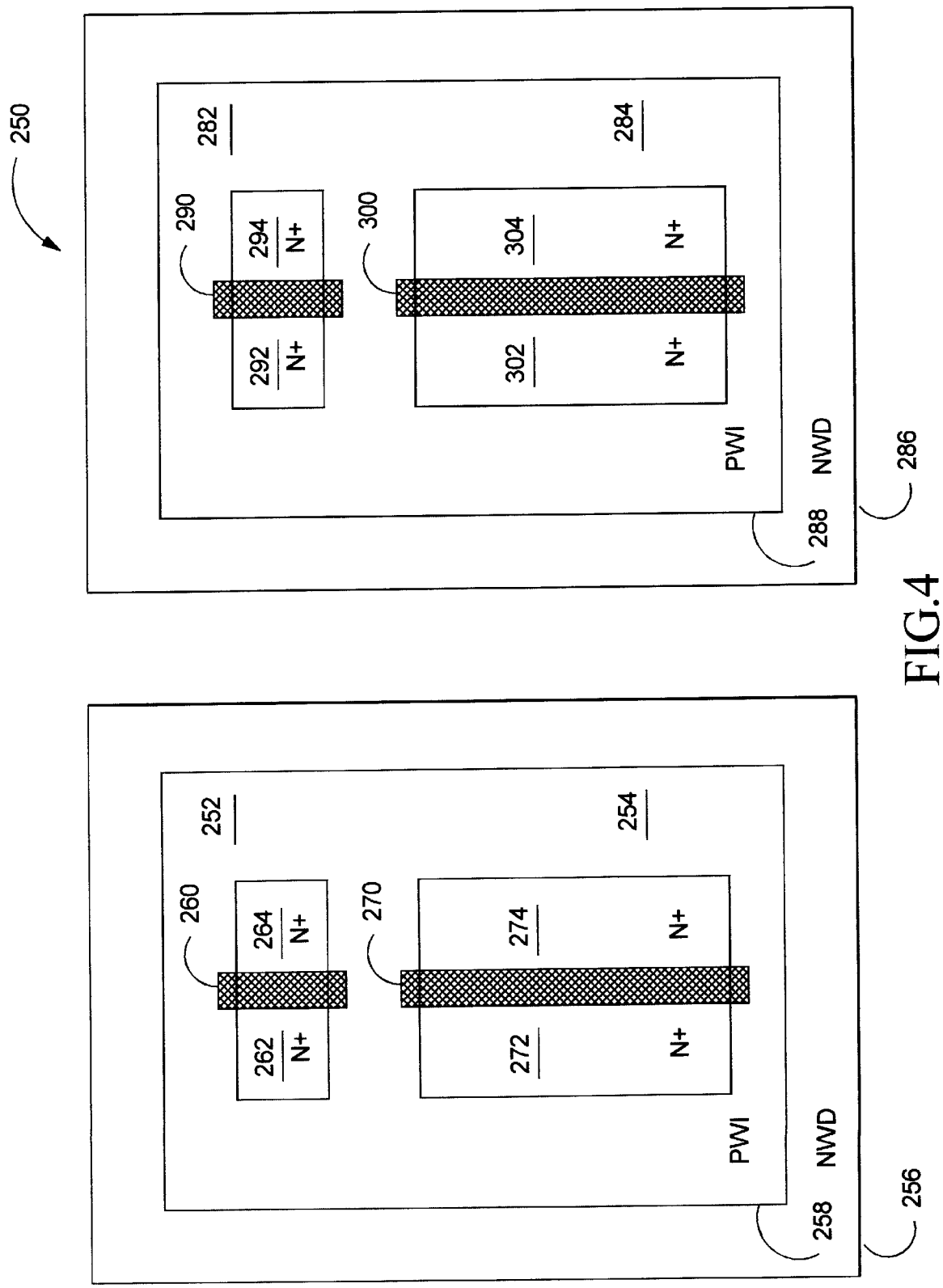
FIG. 4 is the top view of four triple well transistors of the present invention that can be used in the charge pump of FIG. 1.

FIG. 4 shows a top view 250 of four triple well transistors used in the present invention. It shows two transistors 252 and 254 formed inside a P well 258 and an N well 256. Transistor 252 further comprises a gate 260, a source region 262 and a drain region 264. Transistor 252 could correspond to transistor 102 of FIG. 1. Transistor 254 further comprises a gate 270, a source region 272 and a drain region 274. Transistor 254 could correspond to transistor 106 of FIG. 1.

FIG. 4 also shows two transistors 282 and 284 formed inside a P well 288 and an N well 286. Transistor 282 further comprises a gate 290, a source region 292 and a drain region 294. Transistor 282 could correspond to transistor 103 of FIG. 1. Transistor 284 further comprises a gate 280, a source region 282 and a drain region 284. Transistor 284 could correspond to transistor 107 of FIG. 1.

Referring to both FIGS. 1 and 4, the source terminal 141 of transistor 102 and source terminal 142 of transistor 106 are connected to $V_{DD}$. Thus, source regions 262 and 272 of transistors 252 and 254, respectively, have the same potential (i.e., $V_{DD}$. As explained above, P well 258 and N well 256 should have the same potential as source regions 262 and 272. Thus these two wells also have the same potential ($V_{DD}$).

FIG. 1 shows that the gate terminal 144 of transistor 102 is connected to the drain terminal 145 of transistor 106, the source terminal 146 of transistor 103 and the source terminal 147 of transistor 107. As explained above, P well 288 and N well 286 should have the same potential as source regions 292 and 302 (which are coupled to source terminals 146 and 147). Thus in FIG. 4, gate 260, drain region 274, source regions 292 and 302, N well 286 and P well 288 all have the same potential.

FIG. 1 shows that the drain terminal 150 of transistor 102 is connected to the gate 151 of transistor 106. Thus, in FIG. 4, drain region 264 has the same potential as gate 270.

FIG. 1 shows that the gate terminal 153 of transistor 103 is connected to the drain terminal 154 of transistor 107 (in addition to the source terminals 155 and 156 of transistors 104 and 108). Thus in FIG. 4, gate 290 has the same potential as drain region 304. FIG. 1 also shows that the drain terminal 158 of transistor 103 is connected to the gate 159 of transistor 107. Thus, in FIG. 4, drain region 294 has the same potential as gate 300.

In FIG. 4, only four of the nine triple well NMOS transistors comprising a charge pump are shown. The structure of transistors 104–105 and 108–109 is similar to that shown in FIG. 4. The structure of transistor 110 is similar to that of transistor 254 of FIG. 4.

In one embodiment of the present invention, the channel lengths of all the triple well transistors are 1.2 μm. The channel widths of transistors 252 and 282 (corresponding to transistors 102 and 103 of FIG. 1) are 6 μm while the channel widths of transistors 254 and 284 (corresponding to transistors 106 and 107 of FIG. 1) are 18 μm. Transistors 104 and 105 have the same structure as transistors 102 and 103, respectively. Thus, these two transistors also have a channel length of 1.2 μm and a channel width of 6 μm. Transistors 108 and 109 have the same structure as transistors 106 and 107, respectively. Thus, these two transistors also have a channel length of 1.2 μm and a channel width of 18 μm. For the output transistor 110 of FIG. 1, the channel width is 15 μm.

The dimension of normal transistors 112–119 and 132–135 of the same embodiment is shown in Table 1.

TABLE 1

| Transistor | Channel Length (μm) | Channel Width (μm) |
|---|---|---|
| 112 | 10 | 18 |
| 113 | 10 | 18 |
| 114 | 20 | 18 |
| 115 | 20 | 24 |
| 116 | 120 | 60 |
| 117 | 120 | 60 |
| 118 | 120 | 60 |
| 119 | 120 | 60 |
| 132 | 1.2 | 4 |
| 133 | 1.2 | 4 |
| 134 | 1.2 | 4 |
| 135 | 1.2 | 4 |

I determine the improvement of the triple well transistors over normal transistors in a charge pump, four tables showing the pump load lines are presented below. In each table, the two right hand columns correspond to the load line of a charge pump constructed using the preferred triple well transistor of the present invention. The two columns to the left of these two right hand columns correspond to the load line of the same charge pump constructed using normal transistors. It is observed that the inventive charge pump has a higher current at almost all voltage levels.

TABLE 2 pump load line, $V_{DD}$ = 2 v, temp = 25 C.
$I_{out}$ measure by root-mean-square, unit in mA

| $V_{out}/I_{out}$ | Prior Art-4-Phase 7.3 MHz | Prior Art-4-Phase 22 MHz | Preferred-4-Phase 7.3 MHz | Preferred-4-Phase 22 MHz |
|---|---|---|---|---|
| 10 v | 0.0 | 0.0 | 0.0 | 0.0 |
| 9 v | 0.0 | 0.0 | 0.01 | 0.02 |
| 8 v | 0.01 | 0.01 | 0.04 | 0.1 |
| 7 v | 0.04 | 0.05 | 0.09 | 0.24 |

TABLE 2-continued pump load line, $V_{DD}$ = 2 v, temp = 25 C.
$I_{out}$ measure by root-mean-square, unit in mA

| $V_{out}/I_{out}$ | Prior Art-4-Phase 7.3 MHz | Prior Art-4-Phase 22 MHz | Preferred-4-Phase 7.3 MHz | Preferred-4-Phase 22 MHz |
|---|---|---|---|---|
| 6 v | 0.08 | 0.12 | 0.19 | 0.48 |
| 5 v | 0.14 | 0.19 | 0.27 | 0.75 |

TABLE 3 pump load line, $V_{DD}$ = 2 v, temp = 25 C.
$I_{out}$ measure by average, unit in mA

| $V_{out}/I_{out}$ | Prior Art-4-Phase 7.3 MHz | Prior Art-4-Phase 22 MHz | Preferred-4-Phase 7.3 MHz | Preferred-4-Phase 22 MHz |
|---|---|---|---|---|
| 10 v | 0.0 | 0.0 | 0.0 | 0.0 |
| 9 v | 0.0 | 0.0 | 0.01 | 0.02 |
| 8 v | 0.01 | 0.01 | 0.03 | 0.9 |
| 7 v | 0.04 | 0.05 | 0.06 | 0.17 |
| 6 v | 0.06 | 0.11 | 0.08 | 0.25 |
| 5 v | 0.09 | 0.166 | 0.10 | 0.31 |

TABLE 4 pump load line, $V_{DD}$ = 3 v, temp = 25 C.
$I_{out}$ measure by Root-mean-square, unit in mA

| $V_{out}/I_{out}$ | Prior Art-4-Phase 7.3 MHz | Prior Art-4-Phase 22 MHz | Preferred-4-Phase 7.3 MHz | Preferred-4-Phase 22 MHz |
|---|---|---|---|---|
| 10 v | 0.11 | 0.266 | 0.29 | 0.75 |
| 9 v | 0.176 | 0.396 | 0.05 | 1.39 |
| 8 v | 0.256 | 0.548 | 0.75 | 1.6 |
| 7 v | 0.341 | 0.712 | 0.92 | 1.75 |
| 6 v | 0.419 | 0.799 | 1.25 | 1.8 |
| 5 v | 0.47 | 0.952 | 1.35 | 1.98 |

TABLE 5 pump load line, $V_{DD}$ = 3 v, temp = 25 C.
$I_{out}$ measure by average, unit in mA

| $V_{out}/I_{out}$ | Prior Art-4-Phase 7.3 MHz | Prior Art-4-Phase 22 MHz | Preferred-4-Phase 7.3 MHz | Preferred-4-Phase 22 MHz |
|---|---|---|---|---|
| 10 v | 0.078 | 0.217 | 0.107 | 0.302 |
| 9 v | 0.108 | 0.300 | 0.128 | 0.423 |
| 8 v | 0.137 | 0.386 | 0.157 | 0.460 |
| 7 v | 0.167 | 0.468 | 0.178 | 0.496 |
| 6 v | 0.190 | 0.520 | 0.205 | 0.504 |
| 5 v | 0.203 | 0.597 | 0.222 | 0.532 |

The result shown in Tables 2–5 shows the following:

(1) The charge pump of the present invention functions efficiently at low $V_{DD}$ voltage. For example, the performance improvement of the inventive charge pump over prior art charge pumps at $V_{DD}$=2 volts is greater than that at $V_{DD}$=3 volts. It is found that the inventive charge pump can operate effectively down to 1.5 volt.

(2) The charge pump of the present invention can operate efficiently at 22 MHz. For example, Table 2 shows that the output current for the inventive charge pump at 22 MHz is about 2.5 times that at 7.3 MHz ($V_{out}$=7 v). On the other hand, there is little difference in the output current of a prior art charge pump at 22 MHz and 7.3 MHz.

Figure 5A:
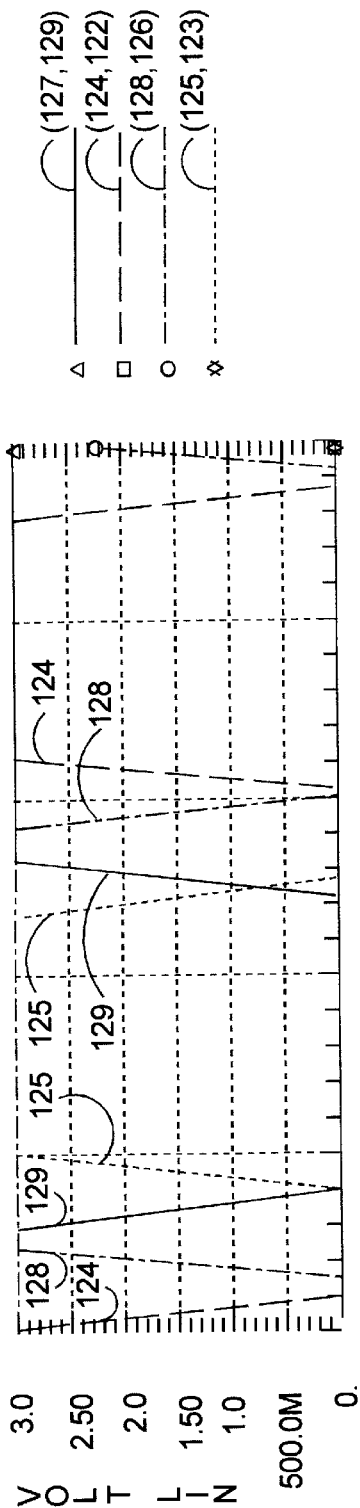
FIG. 5 shows voltage profiles at various points of the charge pump of FIG. 1.
Figure 5B:
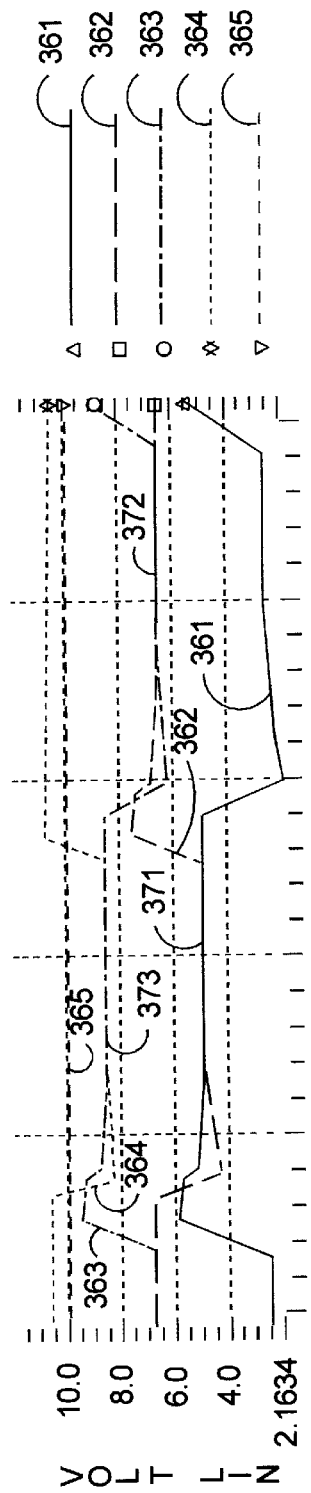
Figure 5C:
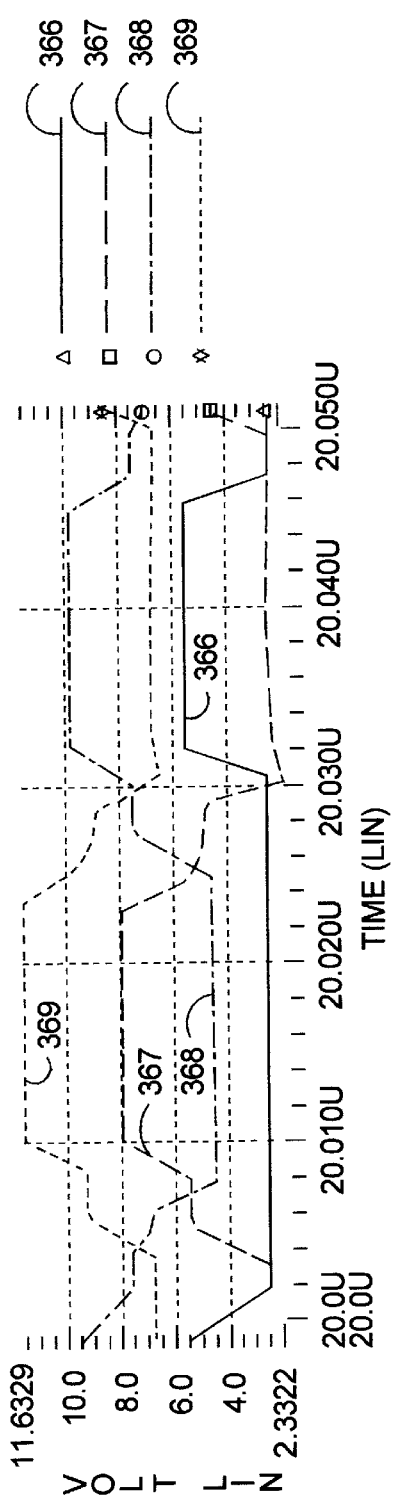

The operation of charge pump 100 is now explained. FIGS. 5A–5C show voltage profiles at nodes 161–168 and 138 of FIG. 1. FIG. 5A shows four clock signals which are the same as signals 124, 125, 128 and 129 of FIG. 2. These clock signals are shown here again so as to provide a reference to understand the voltage profiles. FIG. 5B shows the voltage profiles 361–365 at nodes 165–168 and 138, respectively. FIG. 5C shows the voltage profiles 366–369 at nodes 161–164, respectively. It can be seen at regions 371–373 of FIG. 5B that charges are being pumped to subsequent stages when the triple well transistors 107–109 are turned on. As a result, the voltages of the two adjoining stages are equal at these regions. This pumping effect is enhanced by the extra diode and reduced threshold voltage of the corresponding triple well transistor of the present invention. The improved effect of other triple well transistors can be easily analyzed by person skilled in the art, and will be not explained in detail here.

Figure 6:
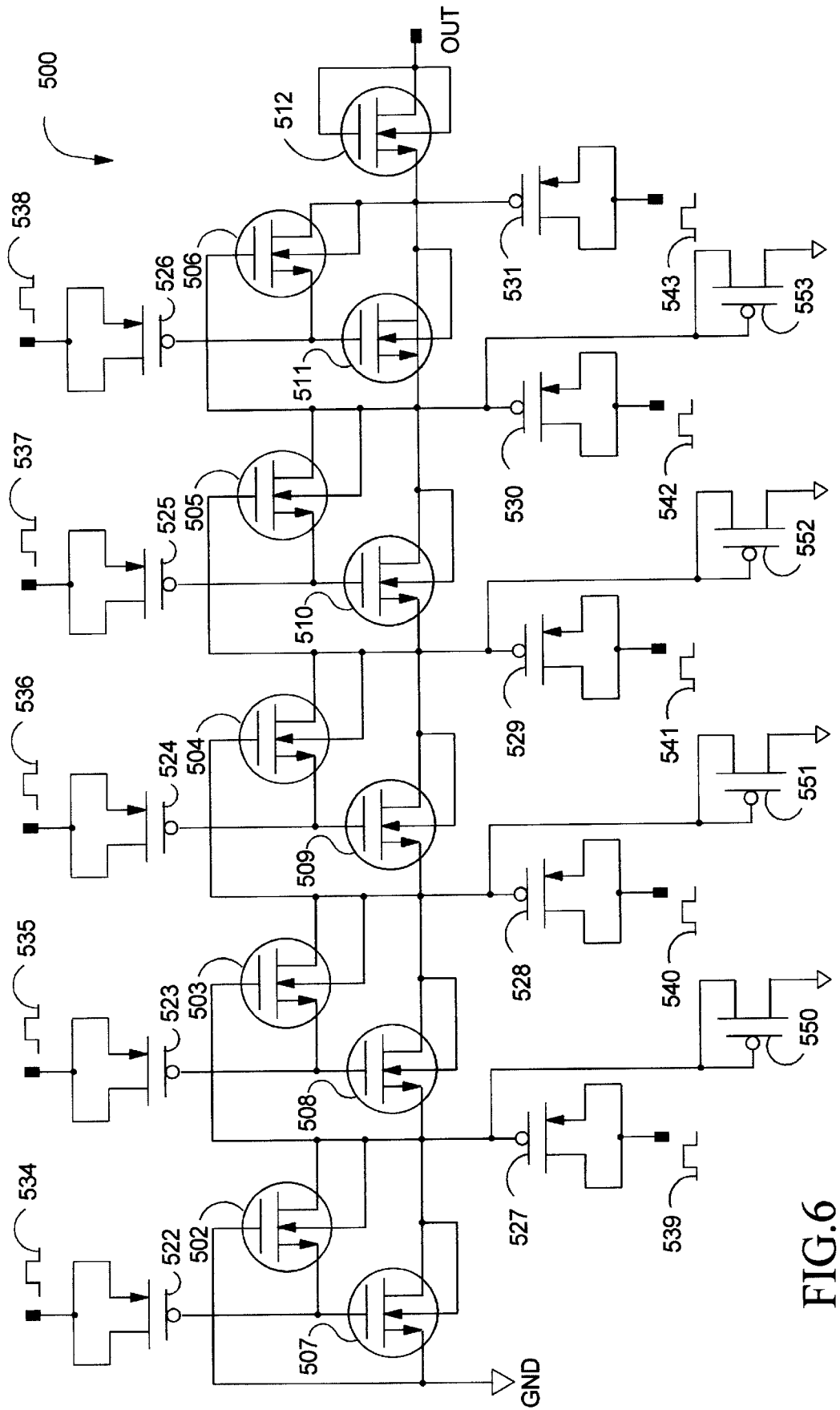
FIG. 6 is a schematic diagram of a negative voltage charge pump of the present invention.

The present invention can be applied to a negative charge pump having a negative output voltage. FIG. 6 is a schematic diagram of a negative charge pump 500 in accordance with the present invention. Charge pump 500 comprises eleven triple well NMOS transistors 502–512 and ten P-channel transistors 522–531. These P-channel transistors function as capacitors, and are coupled to clock signals 534–543. The clock signals are coupled to the corresponding triple well NMOS transistors via the capacitive action of transistors 522–531. Four P-channel transistors 550–553 can be optionally connected to the source terminals of triple well transistors 508–51 1 for initial pull-down purpose. In one embodiment of the present invention, the output voltage at the drain terminal of triple well NMOS 512 is approximately −8 volts when the voltage supplied to charge pump 500 is approximately 3 volts. The use of a triple well structure in transistors 502–512 suppresses the body effect and introduces an extra diode in the same way as discussed above in connection with charge pump 100. Thus, all the beneficial effects described above is also present in charge pump 500.

While several embodiments have been disclosed, it will be readily apparent to those skilled in the art that numerous other modifications and variations not mentioned above can still be made without departing from the spirit and scope of the invention claimed below. For example, the above disclosed triple well structure is not limited to be used in the charge pump design of FIGS. 1 and 6, but instead can be used in practically all charge pump circuits.

What is claimed is:

1. A charge pump comprising:
   a semiconductor body having a particular conductivity type;
   a first well in said semiconductor body having said particular conductivity type;
   a second well in said semiconductor body surrounding said first well and having an opposite conductivity type relative to the particular conductivity type;
   a plurality of transistors arranged to pump a voltage level from a first transistor to a last transistor in response to one or more clock signals, said last transistor having a voltage level substantially higher than, or negative relative to, a power supply voltage coupled to said plurality of transistors;
   at least one of said plurality of transistors having a source and a drain region of said opposite conductivity type formed in said first well, said first well, said second well and said source region being coupled to a common potential.

2. The charge pump of claim 1 wherein said power supply voltage is in an range between approximately 5 and approximately 1.5 volts.

3. The charge pump of claim 1 wherein said power supply voltage is substantially equal to 3 volts.

4. The charge pump of claim 1 wherein said power supply voltage is substantially equal to 2 volts.

5. The charge pump of claim 1 wherein at least one of said clock signals operates at a frequency above 10 MHz.

6. The charge pump of claim 1 wherein a least one of said clock signals operates at a frequency approximately equal to 22 MHz.

7. The charge pump of claim 1 wherein said voltage level at said last transistor is positive.

8. The charge pump of claim 1 wherein said voltage level a t said last transistor is negative.

9. The charge pump of claim 1 further comprising means for coupling said clock signals to said transistors.

10. The charge pump of claim 9 wherein said means for coupling comprises a MOS transistor.

11. A charge pump comprising:
    a semiconductor body having a particular conductivity type;
    a first well in said semiconductor body having said particular conductivity type;
    a second well in said semiconductor body surrounding said first well and having an opposite conductivity type relative to the particular conductivity type;
    a plurality of charge pump stages arranged in series to pump a voltage level from a first stage to a last stage in response to one or more clock signals;
    at least one of the charge pump stages comprising a first transistor having a gate, a source and a drain and a second transistor having a gate coupled to the drain of the first transistor, a source coupled to the source of the first transistor, and a drain coupled to the gate of the first transistor, and wherein the respective drains and sources of the first and second transistors are within the first well, and the sources of the first and second transistors are coupled to the first well.

12. The charge pump of claim 11, wherein the first well and the second well are coupled together to the sources of the first and second transistors.

13. A charge pump comprising:
    a semiconductor body having a particular conductivity type;
    a plurality of charge pump stages arranged in series to pump a voltage level from a first stage to a last stage in response to one or more clock signals;
    the respective charge pump stages in the plurality comprising a first well in said semiconductor body having said particular conductivity type; a second well in said semiconductor body surrounding said first well and having an opposite conductivity type relative to the particular conductivity type; a first transistor having a gate, a source and a drain and a second transistor having a gate coupled to the drain of the first transistor, a source coupled to the source of the first transistor, and a drain coupled to the gate of the first transistor, and wherein the respective drains and sources of the first and second transistors are within the first well, and the sources of the first and second transistors are coupled to the first well.

* * * * *